US006535561B2

(12) United States Patent
Boesch et al.

(10) Patent No.: US 6,535,561 B2
(45) Date of Patent: *Mar. 18, 2003

(54) DUAL-MODE MODULATION SYSTEMS AND METHODS INCLUDING OVERSAMPLING OF NARROW BANDWIDTH SIGNALS AND DC OFFSET COMPENSATION

(75) Inventors: Ronald D. Boesch, Morrisville, NC (US); Domenico Arpaia, Cary, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/151,996

(22) Filed: Sep. 11, 1998

(65) Prior Publication Data

US 2002/0131389 A1 Sep. 19, 2002

Related U.S. Application Data

(63) Continuation-in-part of application No. 08/971,502, filed on Nov. 17, 1997, now Pat. No. 6,137,826.

(51) Int. Cl.$^7$ ................................................. H03M 1/06
(52) U.S. Cl. ...................... 375/296; 375/302; 455/102; 455/553; 341/118; 332/103; 332/119
(58) Field of Search ................................. 375/216, 146, 375/296, 298, 302; 455/552, 553, 103, 102; 341/118; 332/103, 119

(56) References Cited

U.S. PATENT DOCUMENTS

| 4,229,821 A | 10/1980 | de Jager et al. ............... 375/53 |
| 4,812,786 A | 3/1989 | Davarian et al. .......... 332/16 R |

(List continued on next page.)

FOREIGN PATENT DOCUMENTS

| EP | 0 359 609 A1 | 3/1990 |
| EP | 0 655 841 A1 | 5/1995 |
| WO | WO 96/20540 | 7/1996 |

OTHER PUBLICATIONS

International Search Report, PCT/US98/23566, Mar. 31, 1999.
Candy and Temes, "*Oversampling Methods for A/D and D/A Conversion*", Oversampling Delta–Sigma Data Converters, IEEE Press, 1992, pp. 1–25.

*Primary Examiner*—Amanda T. Le
(74) *Attorney, Agent, or Firm*—Myers Bigel Sibley & Sajovec (57) ABSTRACT

A narrow bandwidth signal, such as a narrowband FM signal, is modulated in a modulator that modulates a wide bandwidth signal, such as a CDMA signal, by oversampling the narrow bandwidth signal and applying the oversampled narrow bandwidth signal to the modulator. By oversampling the narrow bandwidth signal, the same fixed low pass filter can be used for both the wide bandwidth signal and the oversampled narrow bandwidth signal. Accordingly, different low pass filters or switched low pass filters are not needed. The DC offset that is introduced by the digital-to-analog converter and/or the low pass filter of the modulator is compensated, preferably in the digital domain, to thereby reduce DC offset within acceptable limits for the modulation that is being used. More preferably, compensation is provided by subtracting from the sampled signal, a digital value representing the DC offset in the filtered analog signal that is introduced by the digital-to-analog converter and/or the low pass filter. A sensor senses the DC offset in the filtered analog signal. An analog-to-digital converter is responsive to the sensor to convert the sensed DC offset into a digital offset signal. A subtractor is responsive to the analog-to-digital converter to subtract the digital DC offset signal from the sampled signal and to apply the sampled signal minus the DC offset signal, to the digital-to-analog converter.

45 Claims, 5 Drawing Sheets

U.S. PATENT DOCUMENTS

| | | | |
|---|---|---|---|
| 5,248,970 A | 9/1993 | Sooch et al. | 341/120 |
| 5,521,559 A | 5/1996 | Ichihara | 332/117 |
| 5,530,722 A | 6/1996 | Dent | 375/298 |
| 5,548,616 A | 8/1996 | Mucke et al. | 375/295 |
| 5,623,485 A | 4/1997 | Bi | 370/209 |
| 5,701,106 A | 12/1997 | Pikkarainen et al. | 332/100 |
| 5,764,692 A | 6/1998 | Mucke | 375/216 |
| 5,771,442 A | 6/1998 | Wang et al. | 455/93 |
| 5,787,362 A | 7/1998 | Matero | 455/553 |
| 5,825,829 A | 10/1998 | Borazjani et al. | 375/308 |
| 5,867,537 A | 2/1999 | Dent | 375/298 |
| 5,867,763 A | 2/1999 | Dean et al. | 455/5.1 |
| 5,872,810 A | 2/1999 | Philips et al. | 375/222 |
| 5,881,376 A | 3/1999 | Lundberg et al. | 455/226.1 |
| 6,006,108 A | 12/1999 | Black et al. | 455/553 |
| 6,014,407 A | 1/2000 | Hunsinger et al. | 375/206 |
| 6,032,028 A | 2/2000 | Dickey et al. | 455/110 |
| 6,100,827 A * | 8/2000 | Boesch et al. | 341/118 |
| 6,137,826 A * | 10/2000 | Boesch | 375/146 |
| 6,154,158 A * | 11/2000 | Walker | 341/118 |

* cited by examiner

DUAL-MODE MODULATION SYSTEMS AND METHODS INCLUDING OVERSAMPLING OF NARROW BANDWIDTH SIGNALS AND DC OFFSET COMPENSATION

CROSS-REFERENCE TO RELATED APPLICATION

This application is a Continuation-in-Part of application Ser. No. 08/971,502, filed Nov. 17, 1997, now U.S. Pat. No. 6,137,826, entitled "Dual-Mode Modulation Systems and Methods Including Oversampling of Narrow Bandwidth Signal", assigned to the assignee of the present application, the disclosure of which is hereby incorporated herein by reference.

FIELD OF THE INVENTION

This invention relates to modulation systems and methods, and more particularly to dual-mode modulation systems and methods.

BACKGROUND OF THE INVENTION

Modulation systems and methods are widely used in transmitters to modulate an information input including voice and/or data onto a carrier. The carrier may be a final carrier or an intermediate carrier. The carrier frequency can be in UHF, VHF, RF, microwave or any other frequency band. Modulators are also referred to as "mixers" or "multipliers". For example, in a mobile radiotelephone, a modulator is used for the radiotelephone transmitter.

As is well known to those having skill in the art, modulation systems and methods for digital input signals generally include a Digital-to-Analog Converter (DAC) that converts the digital input signal into an analog signal. A low pass filter, also referred to as an "anti-aliasing filter", filters the analog signal to produce a filtered analog signal. A modulator modulates the filtered analog signal onto a carrier. The modulator includes a multiplier that is coupled to a local oscillator, such as a Voltage Controlled Oscillator (VCO), and to the filtered analog signal. The carrier including the filtered analog signal may then be transmitted by an antenna.

In modern communications systems, it is often desired to provide dual-mode modulation systems and methods that can modulate two types of communications signals. For example, in mobile radiotelephones, it is often important to provide a modulator that operates both in narrowband FM mode and in wideband Code Division Multiple Access (CDMA) mode. More particularly, in order to provide a mobile radiotelephone that can be used with both an IS-19 AMPS analog system and an IS-95 Direct Sequence Spread Spectrum (DSSS) wideband CDMA system, it is desirable to provide dual-mode modulation systems and methods.

Unfortunately, it may be difficult to provide a dual-mode modulation systems and methods that can handle the disparate bandwidths of the AMPS and CDMA signals. In particular, the narrowband AMPS FM signal has a bandwidth of about 12.5 KHz, while the wideband CDMA signal has a bandwidth of about 615 KHz, or about an order of magnitude wider.

In modem radiotelephone communications, mobile radiotelephones continue to decrease in size, cost and power consumption. In order to satisfy these objectives, it is generally desirable to share circuitry in dual-mode radiotelephones. Shared circuitry can decrease the number of components that are used in the modulator, thereby allowing a decrease in the size thereof. Shared components can also decrease the power consumption of the dual-mode modulation system, which can allow an increase in battery time. Finally, sharing of components can allow a decrease in component cost, thereby allowing a decrease in the overall cost of the radiotelephone.

Figure 1:
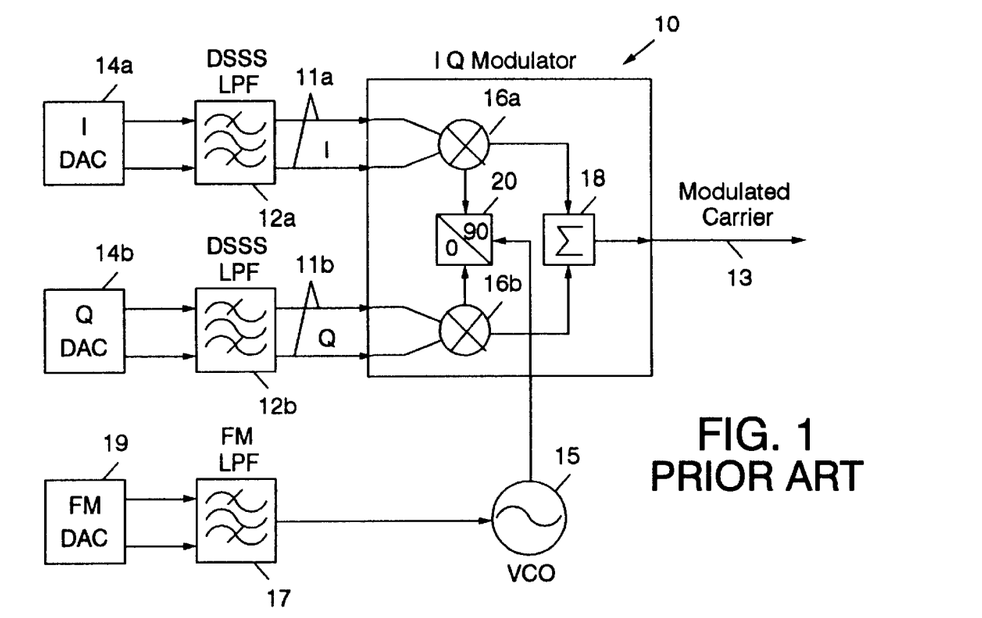
FIG. 1 is a block diagram of a first conventional dual-mode modulation system and method.

FIG. 1 illustrates a first conventional dual-mode modulator. As shown in FIG. 1, an IQ modulator 10, also referred to as a "quadraphase modulator" or a "quadrature modulator" includes a quadrature splitter 20, also known as a 90° phase shifter, and a pair of multipliers 16a, 16b coupled to the quadrature splitter. A local oscillator 15, such as a Voltage Controlled Oscillator (VCO), is coupled to the quadrature splitter 20 to produce 90° phased shifted local oscillator signals. I data 11a and Q data 11b are coupled to a respective multiplier or mixer 16a, 16b respectively. Digital input data is converted to analog data by I Digital-to-Analog Converter (DAC) 14a and Q DAC 14b, respectively. The outputs of the DACs 14a and 14b respectively are applied to low pass filters 12a and 12b respectively to provide the I and Q data inputs 11a and 11b respectively. The modulator modulates the input data on a carrier 13, by summing the outputs of the multipliers 16a, 16b at summing node 218, and transmits the modulated carrier 13 via an antenna.

The DACs 14a and 14b, low pass filters 12a and 12b and IQ modulator 10 may be used to modulate a high bandwidth CDMA signal such as a Direct Sequence Spread Spectrum (DSSS) signal onto a carrier. Since the signal is generated digitally, it is low pass filtered by filters 12a and 12b to let the information through while removing digitally generated spurs and noise.

In order to use the IQ modulator 10 of FIG. 1 in a dual-mode, such as for narrow bandwidth FM signal, a separate FM DAC 19 and a separate FM low pass filter 17 may be provided. Baseband circuitry generates an FM voltage signal that is applied to the tune line of the VCO, to modulate the FM information onto the carrier for transmission according to the AMPS standard. Since the FM voltage signal is generated digitally, it is low pass filtered by FM low pass filter 17 to let the information through while removing digitally generated spurs and noise.

The low pass filter 17 generally has a different bandpass characteristic than the low pass filters 12a and 12b that are part of the CDMA modulator, due to the widely differing bandwidths of the FM and CDMA signals. Accordingly, in this dual-mode embodiment, a separate FM DAC 19 and a separate FM low pass filter 17 is provided. Modulation systems according to FIG. 1 have been designed into many integrated circuit chip sets developed for CDMA standards that also include AMPS functionality. Unfortunately, this technique uses separate DACs and low pass filters, which may increase the size, cost and/or power consumption of the modulator.

Figure 2:
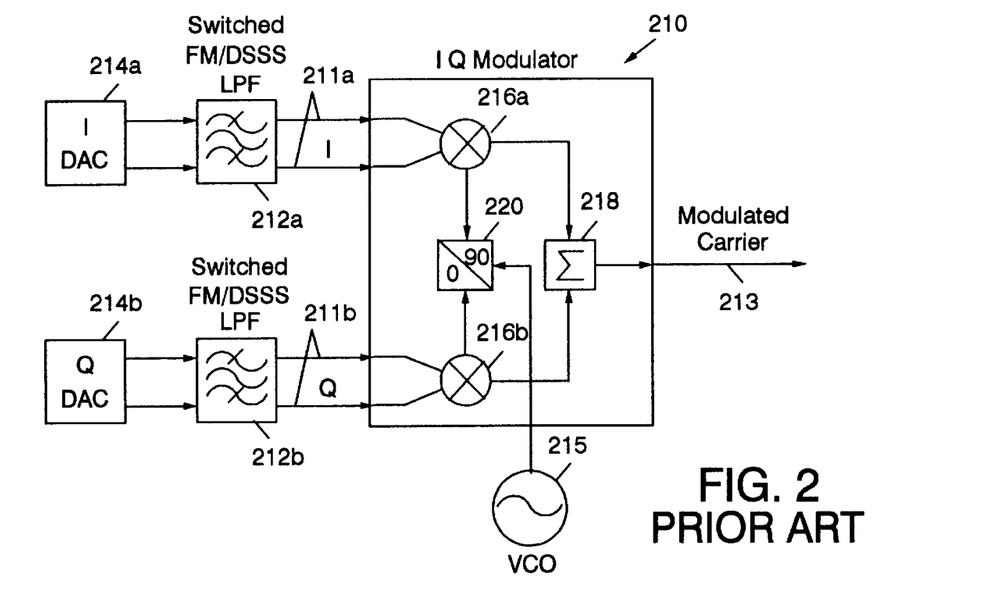
FIG. 2 is a block diagram of a second conventional dual-mode modulation system and method.

A second dual-mode modulation system is illustrated in FIG. 2. In this figure, an IQ modulator 210 including a quadrature splitter 220, a pair of multipliers 216a and 216b, a summing node 218 and a VCO 215 are provided to produce a modulated carrier 213. However, in contrast with FIG. 1, the DACs and low pass filters are shared for the dual-mode operation. In particular, the I DAC and Q DAC 214a and 214b respectively are used for both wideband CDMA and narrowband FM operation. Low pass filters 212a and 212b are also used for wideband CDMA and narrowband FM operation.

Unfortunately, due to the widely disparate bandwidths of the CDMA signal and the FM signal, the low pass filters 212a and 212b should have different band pass characteristics when in the different modes. In order to share the low pass filter, the band pass frequency is switched depending upon mode. Accordingly, while these switched filters 212a, 212b are used in both modes, they may be expensive to implement and may consume excessive power and/or area in a radiotelephone.

In high performance communications systems, it also may be desirable to provide high carrier suppression. In order to provide high carrier suppression, a low DC offset should be produced in the modulation system. For example, the required carrier suppression for FM modulation in an IS-19 AMPS analog system may be approximately −35 dBc. In order to provide an acceptable design margin, it may be preferred for the nominal carrier suppression to be −40 dBc, which can translate into a 14 mV differential DC offset signal when a 2V peak-to-peak differential information signal is generated in a balanced system.

Low DC offset in the digital input signal may be provided using conventional techniques. Unfortunately, however, the modulation system may generate its own DC offset. More specifically, the digital-to-analog converter and/or the low pass filter may generate DC offsets.

The DC offset that is generated in the digital-to-analog converter can be reduced using high performance digital-to-analog converters. Unfortunately, these digital-to-analog converters may be costly and complex. DC offset can be reduced in the low pass filter by providing a passive, off-chip filter with tight tolerance components. Unfortunately, such a passive off-chip filter may be costly and complex, and may consume excessive space in a portable radiotelephone.

SUMMARY OF THE INVENTION

It is therefore an object of the present invention to provide improved dual-mode modulation systems and methods.

It is another object of the present invention to provide dual-mode modulation systems and methods for a first signal and a second signal of narrower bandwidth than the first signal.

It is still another object of the present invention to provide dual-mode modulation systems and methods for a first signal and a second signal of narrower bandwidth than the first signal, that can share components of the modulation system to provide compact, low cost and/or low power dual-mode modulation.

It is yet another object of the present invention to provide dual-mode modulation systems and methods that can generate low DC offset.

These and other objects are provided, according to the present invention, by modulating a narrow bandwidth signal, such as a narrowband FM signal, in a modulator that modulates a wide bandwidth signal, such as a CDMA signal, by oversampling the narrow bandwidth signal and applying the oversampled narrow bandwidth signal to the modulator. By oversampling the narrow bandwidth signal, the same fixed low pass filter can be used for both the wide bandwidth signal and the oversampled narrow bandwidth signal. Accordingly, different low pass filters or switched low pass filters are not needed.

In a particular aspect of the present invention, a CDMA modulator including a sampler is used for dual-mode modulation by applying a narrow bandwidth FM signal to the CDMA modulator, such that the CDMA modulator oversamples the FM signal and modulates the oversampled FM signal. The CDMA modulator includes a fixed low pass filter having a passband that encompasses a CDMA signal and the oversampled FM signal, so that the same fixed low pass filter is used to filter both the CDMA signal and an FM signal. The CDMA modulator may be particularly useful in a radiotelephone where the CDMA signal may be a direct sequence spread spectrum signal and the FM signal may be an analog cellular telephone signal.

Dual-mode modulation systems according to the present invention include means for modulating an applied signal onto a carrier and means for applying a first signal to the modulating means, to thereby modulate the first signal onto a carrier. Oversampling means is included for oversampling a second signal of narrower bandwidth than the first signal. The systems also include means for applying the oversampled second narrower bandwidth signal to the modulating means, to thereby modulate the second narrower bandwidth signal onto a carrier.

The modulating means preferably comprises a digital-to-analog converter and a low pass filter that filters the analog output of the digital-to-analog converter, wherein the low pass filter has a passband that encompasses the first signal, and the oversampled second narrower bandwidth signal, such that the same fixed low pass filter is used to filter both the first signal and the oversampled second narrower bandwidth signal. When the modulating means comprises an IQ modulator having I and Q inputs, the oversampling means preferably comprises first and second samplers.

Dual-mode modulation systems according to the invention also include means for sampling an applied signal, means for converting the sampled signal to an analog signal, means for low pass filtering the analog signal and means for modulating the low pass filtered analog signal onto a carrier. Dual-mode modulation systems also include means for applying a first signal to the sampling means, to thereby modulate the first signal on a carrier using the sampling means, the converting means and the low pass filtering means, and for applying a second signal of narrower bandwidth than the first signal to the sampling means, to thereby oversample the second signal and modulate the second signal on a carrier using the sampling means, the converting means and the low pass filtering means. Accordingly, the same unswitched filters may be used for both the wide and narrow bandwidth signals, to thereby allow reduction in cost, space and/or power consumption.

Dual-mode modulation systems and methods according to the invention also compensate for the DC offset that is introduced by the digital-to-analog converter and/or the low pass filter thereof. Compensation is preferably provided in the digital domain, to thereby reduce DC offset to within acceptable limits for the modulation that is being used. More preferably, compensation is provided by subtracting from the sampled signal, a digital value representing the DC offset in the filtered analog signal that is introduced by the digital-to-analog converter and/or the low pass filter.

Modulation systems according to the invention include a digital-to-analog converter that converts the sampled signal into an analog signal. The analog signal is filtered by a low pass filter to produce a filtered analog signal. The digital-to-analog converter and/or the low pass filter introduce DC offset into the filtered analog signal. A modulator modulates the filtered analog signal onto a carrier. A DC offset compensator compensates for the DC offset in the filtered analog signal that is introduced by the digital-to-analog converter and/or the low pass filter.

DC offset compensators according to the invention preferably include a sensor that senses the DC offset in the filtered analog signal. An analog-to-digital converter is responsive to the sensor, to convert the sensed DC offset into a digital offset signal. A subtractor is responsive to the analog-to-digital converter, to subtract the digital DC offset signal from the sampled signal, and to apply the sampled signal less (minus) the digital DC offset signal, to the digital-to-analog converter. Accordingly, the sensed offset is subtracted in the digital domain. A scaler may also be included that is responsive to the analog-to-digital converter, to scale the digital DC offset signal into a scaled digital DC offset signal. The subtractor is then responsive to the scaler, to subtract the scaled digital DC offset signal from the sampled signal.

The subtractor need not continuously sense the DC offset in the filtered analog signal, but rather may do so on an intermittent and preferably periodic basis. For example, the DC offset compensator may include a latch that is responsive to the analog-to-digital converter to intermittently latch the digital DC offset signal and to apply the latched digital DC offset signal to the subtractor, such that the latched digital DC offset signal is subtracted from the sampled signal. When the analog-to-digital converter is clocked at a first clock rate, the latch can be clocked at a second clock rate that is lower than the first clock rate.

The sensor may comprise a low pass filter that senses the DC offset in the filtered analog signal. In one embodiment, the analog-to-digital converter is a one bit delta-sigma analog-to-digital converter. In another embodiment, a polarity inverter is responsive to the sensor, to periodically invert the polarity of the sensed DC offset signal. The analog-to-digital converter converts the periodically polarity inverted sensed DC offset signal into the digital offset signal, thus reducing the effect of the internal DC offset of the analog-to-digital converter.

DC Offset compensation may be advantageously used with dual bandwidth modulators wherein the sampled signal comprises a selected one of a first digital input signal and a second digital input signal of narrower bandwidth than the first digital input signal. For example, the invention may be used with a first digital input signal that is a CDMA signal, and with a second digital input signal that is an FM signal. More specifically, the CDMA signal may be a direct sequence spread spectrum signal, and the FM signal may be an analog cellular telephone signal. The present invention may also be used in IQ modulators, also referred to as "quadraphase modulators" or "quadrature modulators" that modulate in-phase and quadrature filtered analog signals onto a carrier. Analogous modulation methods may also be provided.

Accordingly, dual-mode modulation systems and methods for a digital input signal can provide low DC offset notwithstanding the introduction of DC offset by the digital-to-analog converter and/or the low pass filters thereof. High performance and costly digital-to-analog converters need not be used. High performance off-chip low pass filters also need not be used.

BRIEF DESCRIPTION OF THE DRAWINGS

FIGS. 4A and 4B, which when placed together as shown form FIG. 4, are a block diagram of a second embodiment of dual-mode modulation systems and methods including DC offset compensation according to the present invention.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 3:
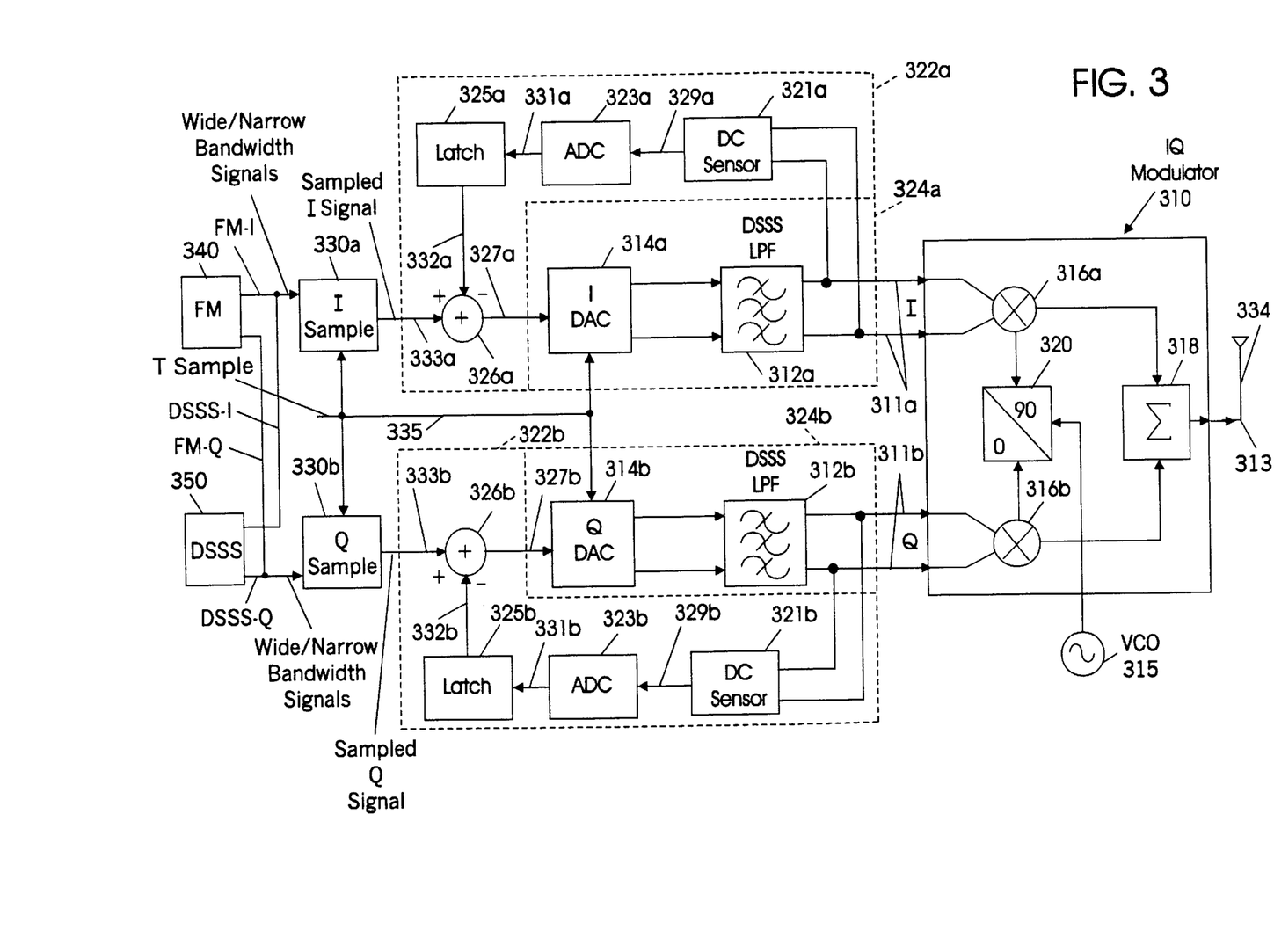
FIG. 3 is a block diagram of dual-mode modulation systems and methods including DC offset compensation according to the present invention.

Referring now to FIG. 3, a block diagram of dual-mode modulation systems and methods according to the invention is shown. As shown in FIG. 3, dual-mode modulation systems and methods include an IQ modulator 310 that includes a VCO 315, a pair of multipliers 316a and 316b, a quadrature splitter 320 and a summing node 318. The interconnection of these elements to form a quadrature modulator are well known to those having skill in the art, and need not be described further herein. As also shown, IQ modulator 310 accepts I inputs 311a and Q inputs 311b and produces an output 313 that modulates these inputs on a carrier.

Still referring to FIG. 3, dual-mode modulation systems and methods according to the invention include a pair of fixed low pass filters 312a and 312b. The fixed low pass filters include a passband which can pass the wide bandwidth signals, such as the CDMA DSSS signals. An I DAC 314a and a Q DAC 314b are also included.

Still referring to FIG. 3, also included is a pair of samplers 330a and 330b, also referred to as an I sampler and a Q sampler, respectively. According to the invention, and as shown in FIG. 3, a source of wide bandwidth signals, such as DSSS signal source 350 and a source of narrow bandwidth signals, such as FM signal source 340 are both applied to the samplers 330a and 330b. DSSS signal source 350 may produce a DSSS-I signal and DSSS-Q signal that are applied to sampler 330a and sampler 330b respectively. FM signal source 330 may produce an FM I signal and an FM Q signal that are applied to the I sampler 330a and the Q sampler 330b respectively. It will be understood that DSSS signal source 350 and FM signal source 340 may be generated as baseband signals in dual-mode radiotelephones. The generation of DSSS signals and FM signals in dual-mode radiotelephones are well known to those having skill in the art and need not be described further herein.

Still referring to FIG. 3, it can be seen that the samplers 330a and 330b and the DACs 314a and 314b operate at a sample rate $T_{sample}$. The sample rate $T_{sample}$ may be controlled by a signal that is applied to control line 335. The sample rate is generally set by the sample rate for the wide bandwidth signals 350. Accordingly, when the narrow bandwidth signals 340 are applied to samplers 330a and 330b, the sampler acts to oversample the narrow bandwidth signals.

By oversampling the narrow bandwidth signals, the same DACs and low pass filters 314 and 312 respectively, may be used for the wide and narrow bandwidth signals.

It will be understood that as part of the wide bandwidth signal modulation, the wide bandwidth signals also may be oversampled by samplers 330a and 330b. In that case, the narrow bandwidth signals are highly oversampled by samplers 330a and 330b. It will also be understood that the sample rate need not be identical for the wide and narrow bandwidth signals. However, the sample rate $T_{sample}$ is generally maintained at a rate such that the same fixed low pass filters 312a and 312b can be used for the wide and narrow bandwidth signals. Accordingly, a dual-mode modulator may use the same unswitched low pass filters for modulating the wide bandwidth signals and the oversampled narrow bandwidth signals, to thereby save cost, space and/or power.

The present invention can use the same fixed low pass filter (without switching) for both the FM signal and spread spectrum signal fed into the IQ modulator. Variable low pass filters, such as switched low pass filters, are not needed. In order to use the same fixed low pass filter, the FM signal is highly oversampled in the DAC, preferably at the same sample rate, $T_{sample}$, as the spread spectrum signal. To be sampled at this rate in the DAC, it is upsampled/interpolated to this highly oversampled rate.

For an IS-95 signal, the sample rate can be 8× or 4.9152 MHz. For convenience, the sample rate for the FM signal can be a divider of a reference clock rate that is near the IS-95 sample rate (19.2 MHz/4 or 4.8 MHz). The sampling spur (~5 MHz) can be reduced by the low pass filter to meet the spur performance specifications of the transmitter for both AMPS and CDMA.

By highly oversampling the FM signal, the sampling noise floor from the DAC can be decreased to acceptable levels for the AMPS transmission (<−60 dBc). The spread spectrum signal is not highly oversampled, rather it is normally oversampled (8×). The sampling noise floor for the DAC for this mode can be decreased to acceptable levels for the IS-95 transmission (<−45 dBc). The spurious free dynamic range for either mode is preferably greater than the difference between the largest signal and the noise floor (>60 dB for AMPS and >45 dB for CDMA). Thus, the quality of the IQ modulator is preferably sufficient to meet the modulation specifications in the AMPS mode, which are generally more severe than the CDMA mode. This is also the case for a conventional system of FIG. 2, where the IQ modulator is shared and the low pass filter is switched.

The present invention may be applied to modulation systems and methods that share an IQ modulator with an FM signal (narrow bandwidth) and a direct sequence spread spectrum signal (wide bandwidth). The analog FM signal is converted to a digital signal at some rate. If the converted rate is low, then it can be upsampled/interpolated to the final desired rate, $T_{sample}$. During A/D conversion, it can immediately be highly oversampled at the final desired rate. The present invention may also be applied to modulation systems and methods that share an IQ modulator with an unspread digital signal (narrow bandwidth) and a direct sequence spread spectrum signal (wide bandwidth). Thus, the present invention may be used in mixed AMPS/CDMA radiotelephones (IS-95), mixed GSM/WCDMA radiotelephones (third generation wideband cellular standards), and other radiotelephones that combine wideband and narrowband signals.

Still referring to FIG. 3, DC offset compensation according to the invention will now be described. Although the sampled I and Q signals 333a and 333b may have low DC offset, the DC offset that is introduced by at least one of the digital-to-analog converters 314a and 314b and the low pass filters 312a and 312b may produce unacceptably high DC offset. The digital-to-analog converters 314a and 314b and low pass filter 312a and 312b are collectively labeled as sources of DC offset by dashed blocks 324a and 324b.

According to the invention, DC offset compensators 322a and 322b are provided, that compensate for the DC offset in the filtered analog signal 311a and 311b that is introduced by the at least one of the digital-to-analog converters 314a and 314b and the low pass filter 312a and 312b. As shown, the DC offset compensators 322a and 322b act upon the sampled signals 333a and 333b in the digital domain to compensate for the DC offset in the filtered analog signals 311a and 311b that is introduced by at least one of the digital-to-analog converters 314a and 314b and the low pass filters 312a and 312b, to thereby reduce the DC offset to within acceptable limits for the modulation scheme that is used.

More specifically, as shown in FIG. 3, each of the DC offset compensators 322a and 322b preferably include a DC sensor 321a, 321b that senses the DC offset in the filtered analog signal 311a, 311b. An Analog-to-Digital Converter (ADC) 323a, 323b converts the sensed DC offset 329a, 329b into a digital DC offset signal 331a and 331b. A subtractor 326a, 326b subtracts the digital DC offset signal 331a, 331b from the sampled signal 333a, 333b and applies the sampled signal less (minus) the DC offset signal 327a, 327b, to the digital-to-analog converter 314a, 314b. Accordingly, the DC offset that is generated in the forward path is sensed and converted to a digital value. The digital value representing the DC offset is then subtracted from the incoming sampled signal 333a, 333b.

As also shown in FIG. 3, the digital DC offset signal need not be calculated at the same frequency as the digital-to-analog conversion by the digital-to-analog converters 314a and 314b, in order to compensate for the DC offset. Rather, the DC offset may be determined intermittently, preferably periodically. Accordingly, as shown in FIG. 1, latches 325a and 325b may be used to intermittently and periodically latch the digital DC offset signals 311a and 311b, such that the latched digital DC offset signals 332a and 332b are subtracted from the sampled signals 333a and 333b. Thus, as will be described below, the latches 325a and 325b and/or the analog-to-digital converters 323a, 323b may be clocked at lower frequencies than the digital-to-analog converters 314a and 314b, because the DC offset will generally not vary as rapidly as the sampled signals 333a and 333b. In a particular example, the DC offset may be sensed once per second, or at other intervals.

It will be understood that in FIG. 3, two separate DC offset compensators 322a and 322b are provided for the two input signal paths. However, it will be understood that a single DC offset compensator may be used for both the I input signal path and the Q input signal path.

Figures 4, 4A:
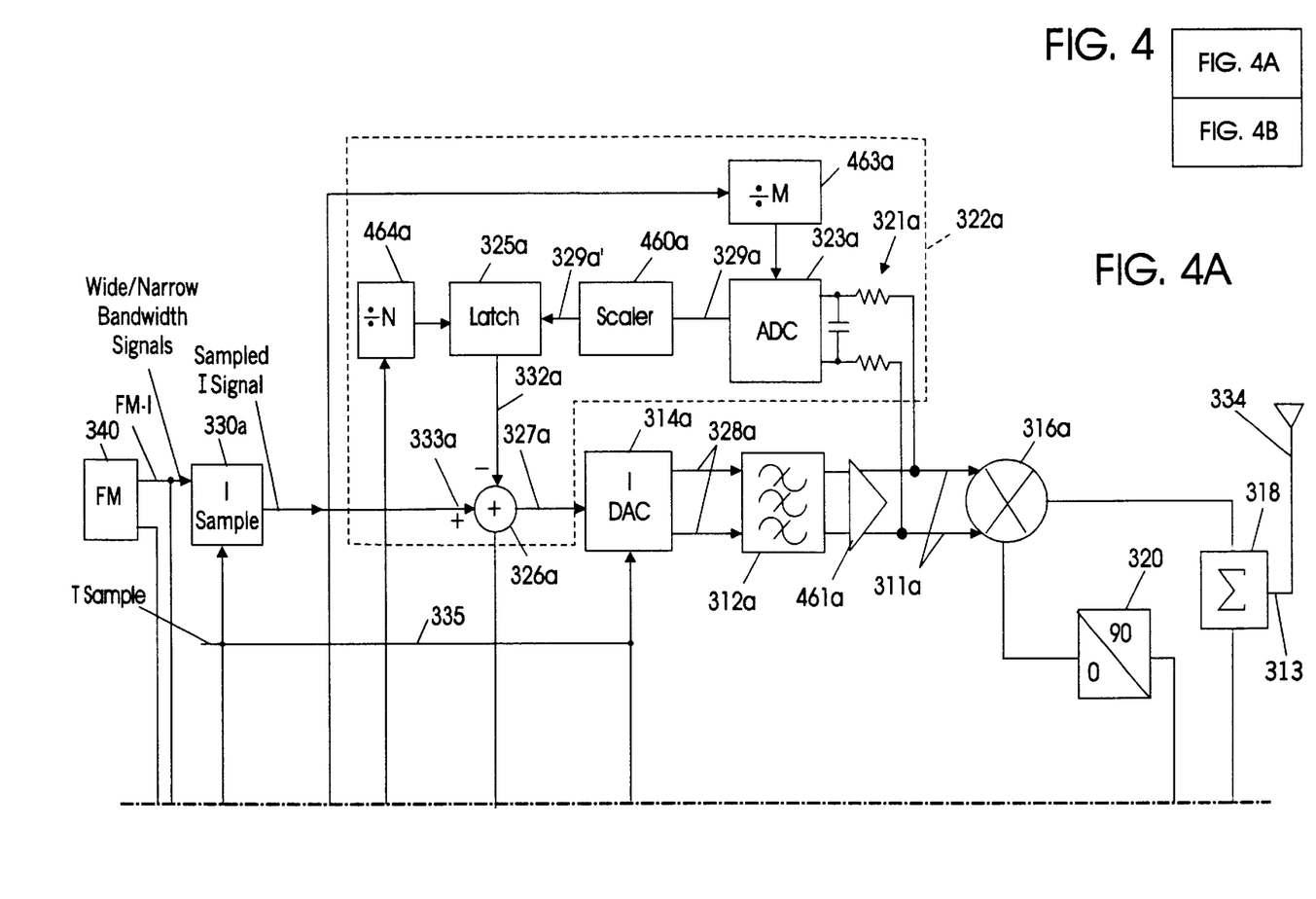
Figure 4B:
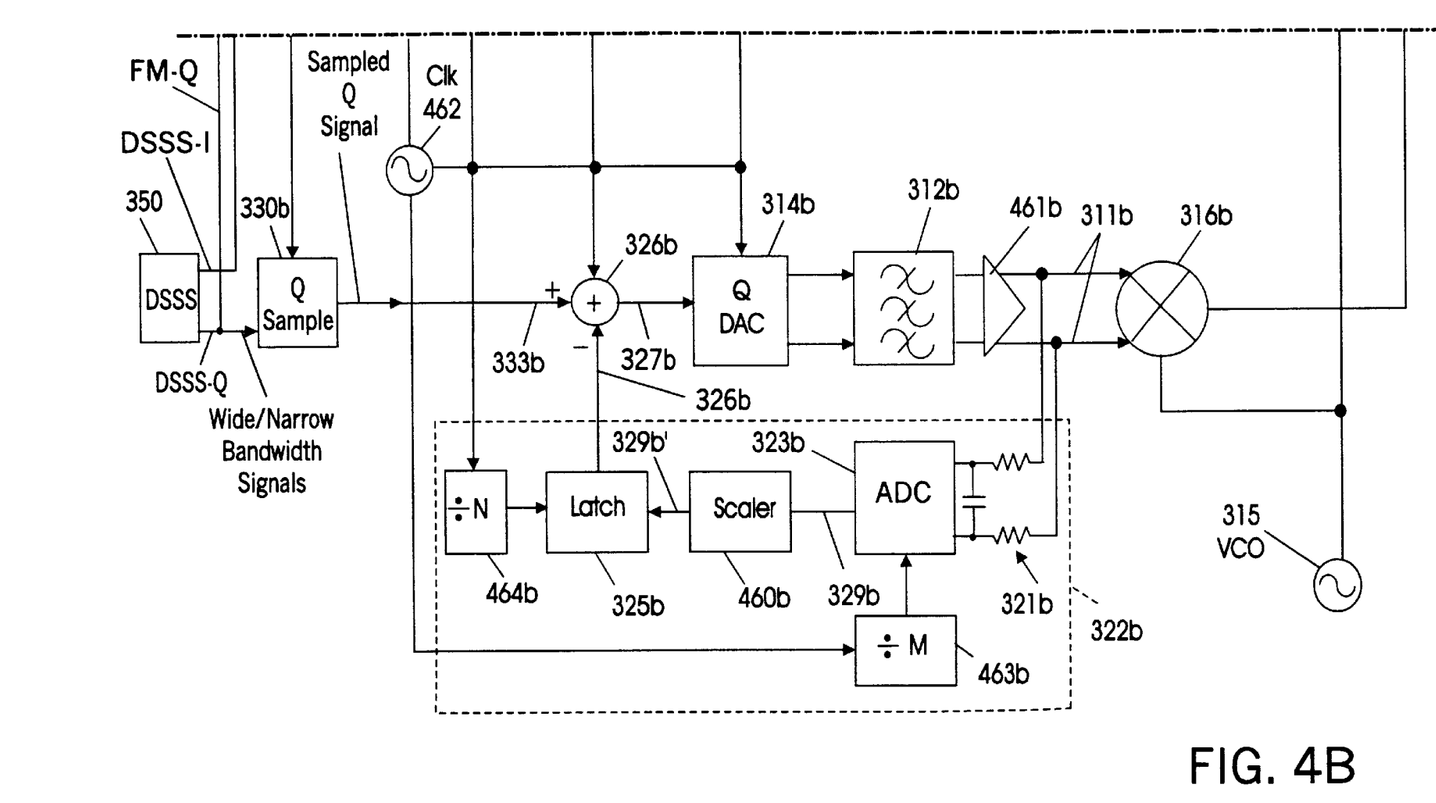

Referring now to FIG. 4, another embodiment of a dual-mode IQ modulator according to the present invention will now be described. In FIG. 4, an optional scaler 460a, 460b is used between a respective analog-to-digital converter 323a, 323b and a respective latch 325a, 325b. The scaler scales the digital DC offset signals 329a, 329b into scaled digital DC offset signals 329a', 329b'. Scaling may be used in order to apply a scaling factor to the digital signal produced by the analog-to-digital converters 323a, 323b. For example, when a differential DC voltage is sensed by the DC sensors 321a, 321b of FIG. 4, a scaling factor may need to be used. Also in FIG. 4, an optional amplifier 461a, 461b is used between a respective low pass filter 312a, 312b and a respective modulator 316a, 316b, to provide amplification if necessary. As shown in FIG. 4, the DC offset compensators 322a, 322b can also compensate for DC offset in the amplifiers 461a, 461b.

As also shown in FIG. 4, timing for the analog-to-digital converters 323a, 323b, for the digital-to-analog converters 314a, 314b and for the latches 325a, 325b may also be provided from a common clock 462. It will be understood that the voltage controlled oscillator 315 is also preferably locked to the same reference as the common clock 462. As shown in FIG. 4, the digital-to-analog converters 314a, 314b are preferably clocked by the clock 462. The analog-to-digital converters 323a, 323b are preferably clocked at a first clock rate that is lower than that of clock 462 using divide by M (÷M) circuits 463a, 463b. Moreover, the latches 425a, 425b are latched at a second clock rate that is even lower than the first clock rate using divide by N (÷N) circuits 464a, 464b. First and second clock rates that are lower than the speed of clock 462 may be used, because the DC offset need not be sensed as often as the sampled signals 333a, 333b are converted to digital, since the DC offset generally changes less rapidly than the sampled signal itself.

The DC sensors 321a, 321b of FIG. 4 may be provided by passive low pass filters with a low corner frequency. A low corner frequency may be used because only the DC component needs to be sensed. Subtraction in the digital domain may also occur at a low rate, that is preferably gated by dividing the clock 462. DC offset compensators of FIG. 4 may be able to cancel a DC offset that is as large as the Least Significant Bit (LSB) of the digital-to-analog converter 314a, 314b.

The DC offset cancellation that can be accomplished may be limited by the DC offset that is introduced by the analog-to-digital converters 323a, 323b in the DC offset compensators 322a, 322b. Accordingly, low DC offset analog-to-digital converters 323a, 323b are preferably used. A preferred analog-to-digital converter 323a, 323b is a one bit delta-sigma converter. A one bit converter may be used so that the feedback path inside the delta-sigma converter may be obtained using a straight feedback connection without the need for intervening components.

Figure 5:
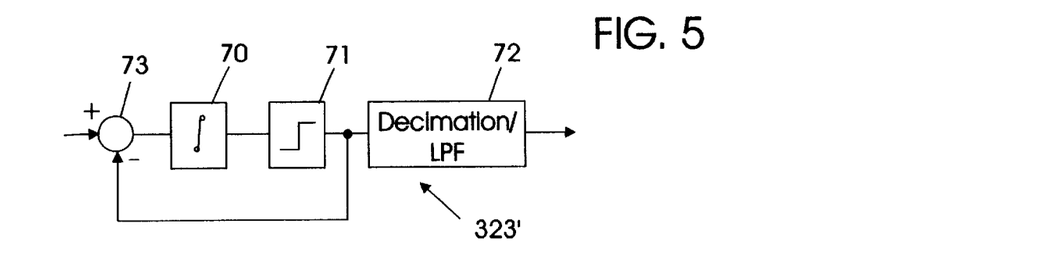
FIG. 5 is a block diagram of a one bit- delta-sigma analog-to-digital converter that may be used to compensate for DC offset according to the present invention.

FIG. 5 illustrates a block diagram of a one bit delta-sigma analog-to-digital converter 323'. As shown in FIG. 5, the analog-to-digital converter 323' includes an integrator 70, a comparator 71 and a decimation/low pass filter 72. The output of the comparator 71 is fed back to the input via a summing node 73. The design of a one bit delta-sigma digital-to-analog converter is well known to those having skill in the art, and is described for example in the textbook by Candy and Temes entitled "Oversampling Delta-Sigma Data Converters", IEEE Press, 1992, in the chapter entitled "Oversampling Methods for A/D and D/A Conversion", pp. 1–25, the disclosure of which is hereby incorporated herein by reference.

Accordingly, DC offsets introduced by elements in the forward path of the delta-sigma converter can be nulled. Thus, the only DC offset contributor may be the analog difference amplifier represented by the summing node 73. DC offset can be reduced in this difference amplifier 73, for example by selecting the decimation low pass filter 72 to have a corner at 10 Hz. Thus, the difference amplifier 73 may operate at a very low frequency, for example 10 kHz. The difference amplifier 73 thus can be made with large geometry, low frequency transistors that may have excellent component matching when used in a process that also includes the high frequency digital-to-analog converters 314a, 314b. This good matching can produce low DC offset in the delta-sigma converter.

Preferably, the corner frequency of the sensor 321 may be chosen to be low enough to roll off modulation, and thereby keep modulation out of the feedback loop. The frequency of the one bit delta-sigma converter is preferably selected so as to remove this modulation without aliasing errors.

The rate of latching by the latch 325 is preferably low enough so that the open loop system has settled. The resolution of the feedback is preferably within one least significant bit of the digital-to-analog converter 314. This resolution may be determined by the oversampling ratio between the input and output of the decimation/low pass filter 72.

The largest error correction may be available for the first subtraction. This correction may be accomplished in one step. Alternatively, this correction can be made smoother through a digital filter that may be placed between the latch 325 and the subtractor 326. Alternatively, the transition can be made smoother by constraining the latch to move only one least significant bit per latch instant. The selection may be made based on the desired speed to initially set the compensation. Thereafter, the DC offset compensator may operate in tracking mode, and the same techniques may be used.

Figure 6:
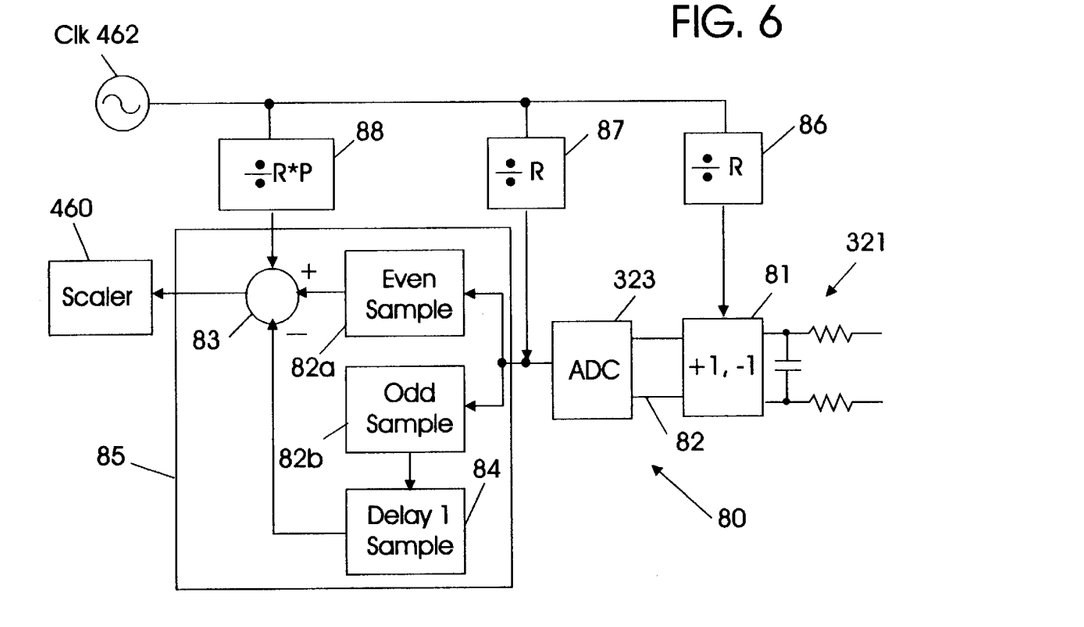
FIG. 6 illustrates another embodiment of an analog-to-digital converter than can be used to compensate for DC offset according to the present invention.
Figure 7:
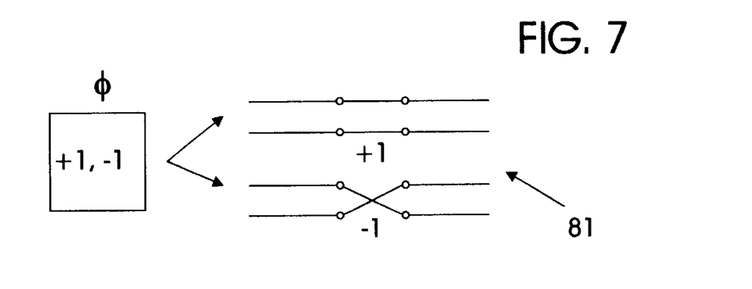
FIG. 7 illustrates operation of a polarity inverter than may be used in FIG. 6.

FIG. 6 illustrates another embodiment of an analog-to-digital converter system 80 that can use any type of analog-to-digital converter 323. As shown in FIG. 6, a polarity inverter 81 is included that periodically inverts the polarity of the sensed DC offset signal. Operation of the polarity inverter 81 is described schematically in FIG. 7.

Referring back to FIG. 6, the analog-to-digital converter 323 converts the periodically polarity-inverted sensed DC offset signal 82 into a digital offset signal. Since alternate samples have been inverted, even samples and odd samples are then latched in first and second latches 82a, 82b. Prior to subtraction by a subtractor 83, one of the samples, such as the odd samples in latch 82b, are delayed by a delay 84.

Subtraction of the polarity inversion samples in block 85 may be clocked using the clock 462, wherein the clock 462 is divided by R and applied to the polarity inverter 81 and analog-to-digital converter 323 by first and second divide by R (÷R) circuits 86, 87. A slower clock that is produced by divide by R times P (÷R*P) circuit 88 may be used to clock the subtractor 83.

The analog-to-digital converter system 80 of FIG. 6 can produce low DC offset due to the following relationships:

$$M_0 = DC_{offset} + E_{measurement},$$

$$M_1 = DC_{offset} + E_{measurement}, \text{ and}$$

$$DC_{offset} = (M_0 - M_1)/2,$$

where $M_0$ is the error measured in one state of the inverter 81, $M_1$ is the error measured in the other state of the inverter 81, $DC_{offset}$ is the DC offset signal 311 and $E_{measurement}$ is the DC error of the measurement system of FIG. 6, that is assumed to be constant between measurements.

When the polarity is changed or inverted, the sign of the measured DC offset changes, but the DC error in the measurement system is unchanged. The error is measured in one state $M_0$ of the inverter and is remeasured in the other state $M_1$. These two measurements are subtracted from each other and scaled by the scaler 460 in the digital domain after the analog-to-digital converter 80. This subtraction can remove any DC error in the analog-to-digital converter 80. In order to line up the even samples with the odd samples, a delay 84 may be used. Thus, DC error in the analog-to-digital converter can be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A dual-mode modulation system comprising:
   means for sampling an applied signal;
   means for converting the sampled signal to an analog signal;
   means for low pass filtering the analog signal to produce a filtered analog signal, at least one of the means for converting and the means for low pass filtering introducing DC offset into the filtered analog signal;
   means for modulating the low pass filtered analog signal onto a carrier;
   means for compensating for the DC offset in the filtered analog signal that is introduced by the at least one of the means for converting and the means for low pass filtering;
   means for applying a first signal to the sampling means to thereby modulate the first signal on a carrier using the sampling means, the converting means and the low pass filtering means, and for applying a second signal of narrower bandwidth than the first signal to the sampling means to thereby sample the second signal and modulate the second signal on a carrier using the sampling means, the converting means and the low pass filtering means; and
   wherein the means for compensating further comprises:
     means for sensing the DC offset in the filtered analog signal;
     means for converting the sensed DC offset into a digital DC offset signal;
     means for subtracting the digital DC offset signal from the sampled signal, and for applying the sampled signal less the DC offset signal to the means for converting the digital input signal into an analog signal; and
     means for scaling the digital DC offset signal into a scaled digital DC offset signal;
     the means for subtracting being responsive to the means for scaling, to subtract the scaled digital DC offset signal from the sampled signal.

2. A dual-mode modulation system according to claim 1 wherein the low pass filtering means is a fixed low pass filter having a passband that encompasses the sampled first signal and the sampled second narrower bandwidth signal, such that the fixed low pass filter is used to filter both the first signal and the second narrower bandwidth signal.

3. A dual-mode modulation system according to claim 1 wherein the first signal is a CDMA signal and wherein the second signal is an FM signal.

4. A dual-mode modulation system according to claim 3 wherein the CDMA signal is a direct sequence spread spectrum signal and wherein the FM signal is an analog cellular telephone signal.

5. A dual-mode modulation system according to claim 1
   wherein the modulating means comprises an IQ modulator having I and Q inputs; and
   wherein the sampling means comprises first and second samplers, the first sampler being responsive to the I input and the second sampler being responsive to the Q input.

6. A dual-mode modulation system according to claim 1 wherein the means for compensating comprises means for subtracting from the sampled signal, a digital value representing the DC offset in the filtered analog signal that is introduced by the at least one of the means for converting and the means for low pass filtering.

7. A dual-mode modulation system according to claim 1 wherein the means for compensating comprises:
   means for sensing the DC offset in the filtered analog signal;
   means for converting the sensed DC offset into a digital DC offset signal; and
   means for subtracting the digital DC offset signal from the sampled signal, and for applying the sampled signal less the DC offset signal to the means for converting the digital input signal into an analog signal.

8. A dual-mode modulation system according to claim 1 wherein the means for sensing comprises means for low pass filtering.

9. A dual-mode modulation system according to claim 1 wherein the means for converting the sensed DC offset into a digital DC offset signal comprises a one-bit delta-sigma analog-to-digital converter.

10. A dual-mode modulation system comprising:
    means for sampling an applied signal;
    means for converting the sampled signal to an analog signal;
    means for low pass filtering the analog signal to produce a filtered analog signal, at least one of the means for converting and the means for low pass filtering introducing DC offset into the filtered analog signal;
    means for modulating the low pass filtered analog signal onto a carrier;
    means for compensating for the DC offset in the filtered analog signal that is introduced by the at least one of the means for converting and the means for low pass filtering;
    means for applying a first signal to the sampling means to thereby modulate the first signal on a carrier using the sampling means, the converting means and the low pass filtering means, and for applying a second signal of narrower bandwidth than the first signal to the sampling means to thereby sample the second signal and modulate the second signal on a carrier using the sampling means, the converting means and the low pass filtering means; and
    wherein the means for compensating further comprises:
      means for sensing the DC offset in the filtered analog signal;
      means for converting the sensed DC offset into a digital DC offset signal;
      means for subtracting the digital DC offset signal from the sampled signal, and for applying the sampled signal less the DC offset signal to the means for converting the digital input signal into an analog signal; and
      means for intermittently latching the digital DC offset signal, and for applying the latched digital DC offset signal to the means for subtracting, such that the latched digital DC offset signal is subtracted from the sampled signal.

11. A dual-mode modulation system according to claim 10 wherein the means for converting the sensed DC offset into a digital DC offset signal is clocked at a first clock rate and wherein the means for intermittently latching is clocked at a second clock rate that is lower than the first clock rate.

12. A dual-mode modulation system according to claim 10 wherein the
means for compensating further comprises:
means for scaling the digital DC offset signal into a scaled digital DC offset signal;
the means for intermittently latching being responsive to the means for scaling to periodically latch the scaled digital DC offset signal such that the latched scaled digital DC offset signal is subtracted from the sampled signal.

13. A dual-mode modulation system comprising:
means for sampling an applied signal;
means for converting the sampled signal to an analog signal;
means for low pass filtering the analog signal to produce a filtered analog signal, at least one of the means for converting and the means for low pass filtering introducing DC offset into the filtered analog signal;
means for modulating the low pass filtered analog signal onto a carrier;
means for compensating for the DC offset in the filtered analog signal that is introduced by the at least one of the means for converting and the means for low pass filtering;
means for applying a first signal to the sampling means to thereby modulate the first signal on a carrier using the sampling means, the converting means and the low pass filtering means, and for applying a second signal of narrower bandwidth than the first signal to the sampling means to thereby sample the second signal and modulate the second signal on a carrier using the sampling means, the converting means and the low pass filtering means; and
wherein the means for compensating further comprises:
means for sensing the DC offset in the filtered analog signal;
means for converting the sensed DC offset into a digital DC offset signal;
means for subtracting the digital DC offset signal from the sampled signal, and for applying the sampled signal less the DC offset signal to the means for converting the digital input signal into an analog signal; and
means for periodically inverting the polarity of the sensed DC offset and for applying the polarity inverted sensed DC offset to the means for converting the sensed DC offset in a digital DC offset signal.

14. A dual-mode radiotelephone comprising:
means for sampling an applied signal;
means for converting the sampled signal to an analog signal;
means for low pass filtering the analog signal to produce a filtered analog signal, at least one of the means for converting and the means for low pass filtering introducing DC offset into the filtered analog signal;
means for modulating the low pass filtered analog signal onto a radiotelephone carrier;
means for compensating for the DC offset in the filtered analog signal that is introduced by the at least one of the means for converting and the means for low pass filtering;
means for generating a first radiotelephone signal and a second radiotelephone signal of narrower bandwidth than the first radiotelephone signal; means for applying the first radiotelephone signal to the sampling means to thereby modulate the first radiotelephone signal on a carrier using the sampling means, the converting means and the low pass filtering means, and for applying the second radiotelephone signal of narrower bandwidth than the first radiotelephone signal to the sampling means to thereby sample the second radiotelephone signal and modulate the second radiotelephone signal on a carrier using the sampling means, the converting means and the low pass filtering means; and
wherein the means for compensating further comprises:
means for sensing the DC offset in the filtered analog signal;
means for converting the sensed DC offset into a digital DC offset signal;
means for subtracting the digital DC offset signal from the sampled signal, and for applying the sampled signal less the DC offset signal to the means for converting the digital input signal into an analog signal; and
means for scaling the digital DC offset signal into a scaled digital DC offset signal;
the means for subtracting being responsive to the means for scaling, to subtract the scaled digital DC offset signal from the sampled signal.

15. A dual-mode radiotelephone according to claim 14 wherein the low pass filtering means is a fixed low pass filter having a fixed low pass filter having a passband that encompasses the sampled first signal and the sampled second narrower bandwidth signal, such that the fixed low pass filter is used to filter both the first radiotelephone signal and the second narrower bandwidth radiotelephone signal.

16. A dual-mode radiotelephone according to claim 14 wherein the first radiotelephone signal is a CDMA signal and wherein the second radiotelephone signal is an FM signal.

17. A dual-mode radiotelephone according to claim 16 wherein the CDMA signal is a direct sequence spread spectrum signal and wherein the FM signal is an analog cellular telephone signal.

18. A dual-mode radiotelephone according to claim 14:
wherein the modulating means comprises an IQ modulator having I and Q inputs; and
wherein the sampling means comprises first and second samplers, the first sampler being responsive to the I input and the second sampler being responsive to the Q input.

19. A dual-mode radiotelephone according to claim 14 wherein the means for compensating comprises means for subtracting from the sampled signal, a digital value representing the DC offset in the filtered analog signal that is introduced by the at least one of the means for converting and the means for low pass filtering.

20. A dual-mode radiotelephone according to claim 14 wherein the means for compensating comprises:
means for sensing the DC offset in the filtered analog signal;
means for converting the sensed DC offset into a digital DC offset signal; and
means for subtracting the digital DC offset signal from the sampled signal, and for applying the sampled signal less the DC offset signal to the means for converting the digital input signal into an analog signal.

21. A dual-mode radiotelephone comprising:

means for sampling an applied signal;

means for converting the sampled signal to an analog signal;

means for low pass filtering the analog signal to produce a filtered analog signal, at least one of the means for converting and the means for low pass filtering introducing DC offset into the filtered analog signal;

means for modulating the low pass filtered analog signal onto a radiotelephone carrier;

means for compensating for the DC offset in the filtered analog signal that is introduced by the at least one of the means for converting and the means for low pass filtering;

means for generating a first radiotelephone signal and a second radiotelephone signal of narrower bandwidth than the first radiotelephone signal;

means for applying the first radiotelephone signal to the sampling means to thereby modulate the first radiotelephone signal on a carrier using the sampling means, the converting means and the low pass filtering means, and for applying the second radiotelephone signal of narrower bandwidth than the first radiotelephone signal to the sampling means to thereby sample the second radiotelephone signal and modulate the second radiotelephone signal on a carrier using the sampling means, the converting means and the low pass filtering means; and wherein the means for compensating further comprises:
    means for sensing the DC offset in the filtered analog signal;
    means for converting the sensed DC offset into a digital DC offset signal;
    means for subtracting the digital DC offset signal from the sampled signal, and for applying the sampled signal less the DC offset signal to the means for converting the digital input signal into an analog signal; and
    means for intermittently latching the digital DC offset signal, and for applying the latched digital DC offset signal to the means for subtracting, such that the latched digital DC offset signal is subtracted from the sampled signal.

22. A dual-mode radiotelephone according to claim 21 wherein the means for converting the sensed DC offset into a digital DC offset signal is clocked at a first clock rate and wherein the means for intermittently latching is clocked at a second clock rate that is lower than the first clock rate.

23. A dual-mode radiotelephone according to claim 21 wherein the means for compensating further comprises:

means for scaling the digital DC offset signal into a scaled digital DC offset signal;

the means for intermittently latching being responsive to the means for scaling to periodically latch the scaled digital DC offset signal such that the latched scaled digital DC offset signal is subtracted from the sampled signal.

24. A dual-mode radiotelephone comprising:

means for sampling an applied signal;

means for converting the sampled signal to an analog signal;

means for low pass filtering the analog signal to produce a filtered analog signal, at least one of the means for converting and the means for low pass filtering introducing DC offset into the filtered analog signal;

means for modulating the low pass filtered analog signal onto a radiotelephone carrier;

means for compensating for the DC offset in the filtered analog signal that is introduced by the at least one of the means for converting and the means for low pass filtering;

means for generating a first radiotelephone signal and a second radiotelephone signal of narrower bandwidth than the first radiotelephone signal;

means for applying the first radiotelephone signal to the sampling means to thereby modulate the first radiotelephone signal on a carrier using the sampling means, the converting means and the low pass filtering means, and for applying the second radiotelephone signal of narrower bandwidth than the first radiotelephone signal to the sampling means to thereby sample the second radiotelephone signal and modulate the second radiotelephone signal on a carrier using the sampling means, the converting means and the low pass filtering means; and wherein the compensating means further comprises:
    means for sensing the DC offset in the filtered analog signal;
    means for converting the sensed DC offset into a digital DC offset signal;
    means for subtracting the digital DC offset signal from the sampled signal, and for applying the sampled signal less the DC offset signal to the means for converting the digital input signal into an analog signal; and
    means for periodically inverting the polarity of the sensed DC offset and for applying the polarity inverted sensed DC offset to the means for converting the sensed DC offset in a digital DC offset signal.

25. A dual-mode radiotelephone according to claim 24 wherein the means for converting the sensed DC offset into a digital DC offset signal comprises a one-bit delta-sigma analog-to-digital converter.

26. A dual-mode radiotelephone comprising:

a sampler that samples an applied signal;

a digital-to-analog converter that converts the sampled signal into an analog signal;

a low pass filter that filters the analog signal to produce a filtered analog signal, at least one of the digital-to-analog converter and the low pass filter introducing DC offset into the filtered analog signal;

a modulator that modulates the filtered analog signal onto a radiotelephone carrier;

a DC offset compensator that compensates for the DC offset in the filtered analog signal that is introduced by the at least one of the digital-to-analog converter and the low pass filter;

a circuit that generates a first radiotelephone signal and a second radiotelephone signal of narrower bandwidth than the first radiotelephone signal, that applies the first radiotelephone signal to the sampler to thereby modulate the first radiotelephone signal on a carrier using the sampler, the digital-to-analog converter and the low pass filter, and that applies the second radiotelephone signal of narrower bandwidth than the first radiotelephone signal to the sampler, to thereby sample the second radiotelephone signal and modulate the second radiotelephone signal on a carrier using the sampler, the digital-to-analog converter and the low pass filter;

wherein the DC offset compensator comprises:

a sensor that senses the DC offset in the filtered analog signal;

an analog-to-digital converter that is responsive to the sensor to convert the sensed DC offset into a digital DC offset signal;

a subtractor that is responsive to the analog-to-digital converter to subtract the digital DC offset signal from the sampled signal, and to apply the sampled signal less the DC offset signal, to the digital-to-analog converter; and a scaler that is responsive to the analog-to-digital converter to scale the digital DC offset signal into a scaled digital DC offset signal;

the subtractor being responsive to the scaler to subtract the scaled digital DC offset signal from the sampled signal.

27. A dual-mode radiotelephone according to claim 26 wherein the first radiotelephone signal is a CDMA signal and wherein the second radiotelephone signal is an FM signal.

28. A dual-mode radiotelephone according to claim 27 wherein the CDMA signal is a direct sequence spread spectrum signal and wherein the FM signal is an analog cellular telephone signal.

29. A dual-mode radiotelephone according to claim 26 wherein the modulator is an IQ modulator that modulates in-phase and quadrature filtered analog signals onto a carrier.

30. A dual-mode radio telephone according to claim 26 wherein the low pass filter is a fixed low pass filter having a passband that encompasses the sampled first signal and the sampled second narrower bandwidth signal, such that the fixed low pass filter is used to filter both the first radiotelephone signal and the second narrower bandwidth radiotelephone signal.

31. A dual-mode radiotelephone comprising:

a sampler that samples an applied signal;

a digital-to-analog converter that converts the sampled signal into an analog signal;

a low pass filter that filters the analog signal to produce a filtered analog signal, at least one of the digital-to-analog converter and the low pass filter introducing DC offset into the filtered analog signal;

a modulator that modulates the filtered analog signal onto a radiotelephone carrier;

a DC offset compensator that compensates for the DC offset in the filtered analog signal that is introduced by the at least one of the digital-to-analog converter and the low pass filter;

a circuit that generates a first radiotelephone signal and a second radiotelephone signal of narrower bandwidth than the first radiotelephone signal, that applies the first radiotelephone signal to the sampler to thereby modulate the first radiotelephone signal on a carrier using the sampler, the digital-to-analog converter and the low pass filter, and that applies the second radiotelephone signal of narrower bandwidth than the first radiotelephone signal to the sampler, to thereby sample the second radiotelephone signal and modulate the second radiotelephone signal on a carrier using the sampler, the digital-to-analog converter and the low pass filter;

wherein the DC offset compensator comprises:

a sensor that senses the DC offset in the filtered analog signal;

an analog-to-digital converter that is responsive to the sensor to convert the sensed DC offset into a digital DC offset signal;

a subtractor that is responsive to the analog-to-digital converter to subtract the digital DC offset signal from the sampled signal, and to apply the sampled signal less the DC offset signal, to the digital-to-analog converter; and a latch that is responsive to the analog-to-digital converter to intermittently latch the digital DC offset signal, and to apply the latched digital DC offset signal to the subtractor, such that the latched digital DC offset signal is subtracted from the sampled signal.

32. A dual-mode radiotelephone according to claim 31 wherein the analog-to-digital converter is clocked at a first clock rate and wherein the latch is clocked at a second clock rate that is lower than the first clock rate.

33. A dual-mode radiotelephone according to claim 31 wherein the DC offset compensator further comprises:

a scaler that is responsive to the analog-to-digital converter to scale the digital DC offset signal into a scaled digital DC offset signal;

the latch being responsive to the scaler to periodically latch the scaled digital DC offset signal such that the latched scaled digital DC offset signal is subtracted from the sampled signal.

34. A dual-mode radiotelephone comprising:

a sampler that samples an applied signal;

a digital-to-analog converter that converts the sampled signal into an analog signal;

a low pass filter that filters the analog signal to produce a filtered analog signal, at least one of the digital-to-analog converter and the low pass filter introducing DC offset into the filtered analog signal;

a modulator that modulates the filtered analog signal onto a radiotelephone carrier;

a DC offset compensator that compensates for the DC offset in the filtered analog signal that is introduced by the at least one of the digital-to-analog converter and the low pass filter;

a circuit that generates a first radiotelephone signal and a second radiotelephone signal of narrower bandwidth than the first radiotelephone signal, that applies the first radiotelephone signal to the sampler to thereby modulate the first radiotelephone signal on a carrier using the sampler, the digital-to-analog converter and the low pass filter, and that applies the second radiotelephone signal of narrower bandwidth than the first radiotelephone signal to the sampler, to thereby sample the second radiotelephone signal and modulate the second radiotelephone signal on a carrier using the sampler, the digital-to-analog converter and the low pass filter;

wherein the DC offset compensator comprises:

a sensor that senses the DC offset in the filtered analog signal;

an analog-to-digital converter that is responsive to the sensor to convert the sensed DC offset into a digital DC offset signal;

a subtractor that is responsive to the analog-to-digital converter to subtract the digital DC offset signal from the sampled signal, and to apply the sampled signal less the DC offset signal, to the digital-to-analog converter; and a polarity inverter that is responsive to the sensor to periodically invert the polarity of the sensed DC offset and to apply the polarity inverted sensed DC offset to the analog-to-digital converter, the analog-to-digital converter converting the periodically polarity inverted sensed DC offset signal into the digital offset signal.

35. A dual-mode radiotelephone according to claim 34 wherein the analog-to-digital converter is a one-bit delta-sigma analog-to-digital converter.

36. A dual-mode modulation method for a first digital input signal and a second digital input signal having narrower bandwidth than the first digital input signal, comprising the steps of:
- oversampling the second digital input signal;
- converting the first digital input signal and the oversampled second digital input signal into an analog signal;
- low pass filtering the analog signal to produce a filtered analog signal, at least one of the converting and low pass filtering steps introducing DC offset into the filtered analog signal;
- modulating the filtered analog signal onto a carrier;
- compensating for the DC offset in the filtered analog signal that is introduced by the at least one of the converting and low pass filtering steps;
- wherein the compensating step comprises the steps of:
  - sensing the DC offset in the filtered analog signal;
  - converting the sensed DC offset into a digital DC offset signal;
  - subtracting the digital DC offset signal from the first and second oversampled digital input signals; and
  - scaling the digital DC offset signal into a scaled digital DC offset signal.

37. A dual-mode modulation method according to claim 36 wherein the first digital input signal is a CDMA signal and wherein the second digital input signal is an FM signal.

38. A dual-mode modulation method according to claim 37 wherein the CDMA signal is a direct sequence spread spectrum signal and wherein the FM signal is an analog cellular telephone signal.

39. A dual-mode modulation method according to claim 36 wherein the step of modulating comprises the step of IQ modulating in-phase and quadrature filtered analog signals onto a carrier.

40. A dual-mode method according to claim 36 wherein the low pass filtering step comprises the step of employing a fixed low pass filter having a passband that encompasses the first digital input signal and the oversampled second digital input signal, such that the fixed low pass filter is used to filter both the first digital input signal and the oversampled second digital input signal.

41. A dual-mode modulation method for a first digital input signal and a second digital input signal having narrower bandwidth than the first digital input signal, comprising the steps of:
- oversampling the second digital input signal;
- converting the first digital input signal and the oversampled second digital input signal into an analog signal;
- low pass filtering the analog signal to produce a filtered analog signal, at least one of the converting and low pass filtering steps introducing DC offset into the filtered analog signal;
- modulating the filtered analog signal onto a carrier;
- compensating for the DC offset in the filtered analog signal that is introduced by the at least one of the converting and low pass filtering steps;
- wherein the compensating step comprises the steps of:
  - sensing the DC offset in the filtered analog signal;
  - converting the sensed DC offset into a digital DC offset signal;
  - subtracting the digital DC offset signal from the first and second oversampled digital input signals; and
  - intermittently latching the digital DC offset signal.

42. A dual-mode modulation method according to claim 41 wherein the step of converting the sensed DC offset into a digital DC offset signal is clocked at a first clock rate and wherein the step of intermittently latching is clocked at a second clock rate that is lower than the first clock rate.

43. A dual-mode modulation method according to claim 41 wherein the step of compensating further comprises the step of:
- scaling the digital DC offset signal into a scaled digital DC offset signal.

44. A dual-mode modulation method for a first digital input signal and a second digital input signal having narrower bandwidth than the first digital input signal, comprising the steps of:
- oversampling the second digital input signal;
- converting the first digital input signal and the oversampled second digital input signal into an analog signal;
- low pass filtering the analog signal to produce a filtered analog signal, at least one of the converting and low pass filtering steps introducing DC offset into the filtered analog signal;
- modulating the filtered analog signal onto a carrier;
- compensating for the DC offset in the filtered analog signal that is introduced by the at least one of the converting and low pass filtering steps;
- wherein the compensating step comprises the steps of:
  - sensing the DC offset in the filtered analog signal;
  - converting the sensed DC offset into a digital DC offset signal;
  - subtracting the digital DC offset signal from the first and second oversampled digital input signals; and
  - periodically inverting the polarity of the sensed DC offset.

45. A dual-mode modulation method according to claim 44 wherein the step of converting the sensed DC offset into a digital DC offset signal comprises the step of delta-sigma analog-to-digital converting the sensed DC offset into a digital DC offset signal.

* * * * *